(12) United States Patent
Lilly

(10) Patent No.: US 11,784,483 B2
(45) Date of Patent: Oct. 10, 2023

(54) RECLOSER LOCKOUT METHODS AND RELATED DEVICES

(71) Applicant: DUKE ENERGY CORPORATION, Charlotte, NC (US)

(72) Inventor: Andrew Lilly, Apollo Beach, FL (US)

(73) Assignee: DUKE ENERGY CORPORATION, Charlotte, NC (US)

( * ) Notice: Subject to any disclaimer, the term of this patent is extended or adjusted under 35 U.S.C. 154(b) by 44 days.

(21) Appl. No.: 17/667,791

(22) Filed: Feb. 9, 2022

(65) Prior Publication Data

US 2022/0271523 A1 Aug. 25, 2022

Related U.S. Application Data

(60) Provisional application No. 63/306,254, filed on Feb. 3, 2022, provisional application No. 63/148,415, filed on Feb. 11, 2021.

(51) Int. Cl.
*H02H 3/00* (2006.01)
*H02H 3/06* (2006.01)
*H02H 1/00* (2006.01)
*G01R 31/08* (2020.01)

(52) U.S. Cl.
CPC ............. *H02H 3/06* (2013.01); *G01R 31/086* (2013.01); *H02H 1/0007* (2013.01)

(58) Field of Classification Search
None
See application file for complete search history.

(56) References Cited

U.S. PATENT DOCUMENTS

| 3,801,872 A | | 4/1974 | Zocholl et al. |
| 4,994,934 A | * | 2/1991 | Bouhenguel ............ H02H 3/07 361/75 |
| 5,400,206 A | * | 3/1995 | Barnes ................... H02H 3/087 361/72 |
| 6,239,960 B1 | | 5/2001 | Martin |
| 10,727,662 B2 | | 7/2020 | Smith et al. |
| 2002/0158633 A1 | * | 10/2002 | Baumgaertl ............ H02H 1/04 324/424 |
| 2012/0327545 A1 | * | 12/2012 | Witte .................... H02H 3/063 361/88 |

OTHER PUBLICATIONS

"Conductor Short-Circuit Protection" Cooper Bussmann (10 pages) (Dec. 17, 2001).

(Continued)

*Primary Examiner* — Stephen W Jackson
(74) *Attorney, Agent, or Firm* — Myers Bigel, P.A.

(57) ABSTRACT

Methods of controlling lockout of a switching or isolating component of an electrical grid are provided. A method of controlling lockout of a switching or isolating component includes, responsive to a plurality of trips occurring at the switching or isolating component during a predetermined time window, incrementing, by the switching or isolating component, a plurality of counters, respectively, and determining whether a number of the trips meets or exceeds a predetermined threshold. Moreover, the method includes, responsive to meeting or exceeding the predetermined threshold, driving the switching or isolating component to lockout. Related switching or isolating components are also provided.

19 Claims, 6 Drawing Sheets

(56) References Cited

OTHER PUBLICATIONS

"Equipment Damage Curves Cables" Systems Analysis, Inc. (2 pages) (Date Unknown but Admitted Prior Art).
"Equipment Damage Curves Conductors" Systems Analysis, Inc. (3 pages) (Date Unknown but Admitted Prior Art).
"Short-Time Current Ratings of Cables, Conductors, and Bus Bar" Northeast Power Systems, Inc. (1 page) (Date Unknown but Admitted Prior Art).
"Thermal Overload Protection of Cables" Siemens PTD EA (6 pages) (2005).
Zocholl et al. "Thermal Models in Power System Protection" 54th Annual Georgia Tech Protective Relaying Conference (17 pages) (May 3-5, 2000).

\* cited by examiner

RECLOSER LOCKOUT METHODS AND RELATED DEVICES

CROSS-REFERENCE TO RELATED APPLICATIONS

The present application claims priority to U.S. Provisional Patent Application No. 63/148,415, filed on Feb. 11, 2021, and to U.S. Provisional Patent Application No. 63/306,254, filed on Feb. 3, 2022, the entire content of each of which is incorporated herein by reference.

FIELD

The present disclosure generally relates to switching or isolating components of electrical grids and, more particularly, to reclosers.

BACKGROUND

Reclosers, such as automatic circuit reclosers ("ACRs" or "autoreclosers"), are a type of switchgear that can be used in a few underground and most overhead electricity distribution networks to detect and interrupt momentary faults. For example, reclosers can have integrated current and voltage sensors and a protection relay. As most faults, such as those caused by lightning strikes, surges, or foreign objects on distribution lines, are transient, they can typically be resolved by reclosers that temporarily cut off electric power in response to detecting faults and then automatically reclose themselves and restore electric power. Some faults, however, may not completely dissipate, and thus may pose a risk to conductors in a distribution network. As an example, an ongoing low fault current can reduce the structural strength of overhead conductors, and the weakened conductors can fall to the ground and/or increase the risk of fire or other hazards.

SUMMARY

A method of controlling lockout of a switching or isolating component of an electrical grid, according to some embodiments, may include, responsive to a plurality of trips occurring at the switching or isolating component during a predetermined time window, incrementing, by the switching or isolating component, a plurality of counters, respectively, and determining whether a number of the trips meets or exceeds a predetermined threshold. Moreover, the method may include, responsive to meeting or exceeding the predetermined threshold, driving the switching or isolating component to lockout.

DETAILED DESCRIPTION

Figure 1A:
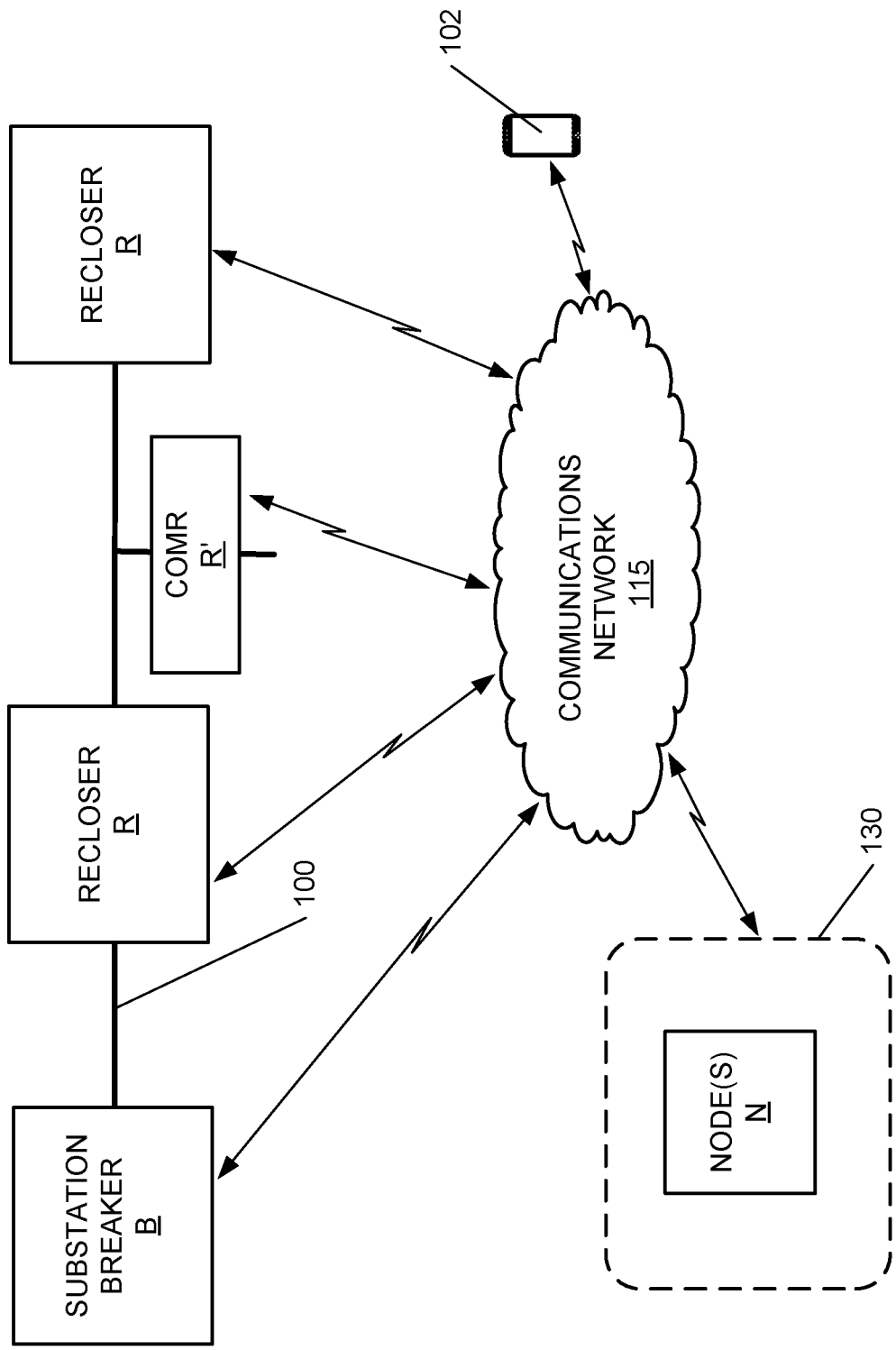
FIG. 1A is a schematic illustration of a portion of an electrical grid that includes a substation breaker, large reclosers, and a cutout-mounted recloser or similar branch line small electronic recloser.

Arcing faults may never completely dissipate. Rather, an arcing fault may result in a current spike that is followed by ongoing low current. This ongoing low fault current may cause reclosers of an electrical grid to operate on fast time-current curves, but may or may not operate on slow time-current curves, which may prevent the reclosers from achieving lockout. An example of lockout is dropping a cutout-mounted recloser out of its cutout. During lockout, a recloser will not attempt to reclose again absent control by a lineman or dispatcher.

Conventional recloser operations may include automatically resetting a recloser (without locking it out) about thirty seconds after detecting a fault. For example, a state machine having a reset or zero-shot state may only look at fast time-current curves of the recloser, and thus may not lock out the recloser because the fault current may be relatively low.

According to the present invention, however, a recloser may be driven to lockout based on a number of trip operations that occur during a moving time window. For example, a microprocessor (or other controller) that is inside the recloser may be configured to command the recloser to drive to lockout in response to determining that the recloser has experienced a predetermined threshold number of trip operations during a moving time window. In some embodiments, the microprocessor may be wirelessly programmable, such as programmable via a cellular link, a Wi-Fi link, a BLUETOOTH® link, or another wireless communications link. As an example, a user may program/reprogram the microprocessor to set a value of the predetermined threshold number of trip operations and/or a value of the length (e.g., in seconds) of the moving time window.

In some embodiments, a recloser may be a three-phase recloser, each phase of which can be tripped. Accordingly, a total number of trip operations that are counted by the recloser may include trips that are detected on one or more phases of the recloser. Moreover, the total number of trip operations may include an initial trip that is caused by a fault current, in addition to subsequent trips that follow the initial trip.

Lockout operations of the present invention may be applied to any type of recloser. For example, reclosers discussed herein may, in some embodiments, include single-phase reclosers and three-phase reclosers. Accordingly, the term "recloser," as used herein, is not limited to either a single-phase recloser or a three-phase recloser. Nor is this term limited to fuse-replacement reclosers or to another type of recloser. Moreover, lockout operations of the present invention may, in some embodiments, be applied to substation breakers, protective relays that control the breakers, and/or other switching or isolating components of an electrical grid.

In some embodiments, the microprocessor of a recloser may control a ring buffer in which each register is a counter that counts a trip of the recloser and operates as a countdown timer before resetting its count. In response to determining that at least a predetermined number of (e.g., six) registers of the ring buffer simultaneously have a non-zero value, then the microprocessor may command the recloser to drive to lockout. Equivalent logic may also/alternatively use count-up timers.

Accordingly, the present invention may detect, using a microprocessor of a recloser, a plurality of trips of the recloser. In response to detecting a predetermined threshold number of (e.g., six) trips during a predetermined time window (e.g., ninety seconds), the microprocessor may command the recloser to drive to lockout. In some embodiments, the predetermined time window may be longer than sixty (or even longer than ninety) seconds, and thus may provide enhanced sensitivity to ongoing low fault current relative to conventional approaches. As an example, the predetermined time window may be ninety seconds, two minutes, three minutes, or longer (e.g., up to twenty minutes). In other embodiments, the predetermined time window may be between forty-five seconds and sixty seconds.

Example embodiments of the present inventive concepts will be described in greater detail with reference to the attached figures.

FIG. 1A is a schematic illustration of a portion of an electrical grid 100 that includes a substation breaker B, large reclosers R, and a cutout-mounted recloser ("COMR") R'. In some embodiments, the grid 100 may also be connected to many customers of an electric utility.

The breaker B, reclosers R, and/or COMR R' may, in some embodiments, communicate with one or more nodes N (e.g., servers) at a data center (or office) 130 and/or with a portable electronic device 102. For example, the communications may occur via a communications network 115, which may include one or more wireless or wired communications networks, such as a local area network (e.g., Ethernet or Wi-Fi), a cellular network, a power-line communication ("PLC") network, and/or a fiber (such as a fiber-optic) network. The electronic device 102 may be provided at various locations, and may comprise a desktop computer, a laptop computer, a tablet computer, and/or a smartphone.

Figure 1B:
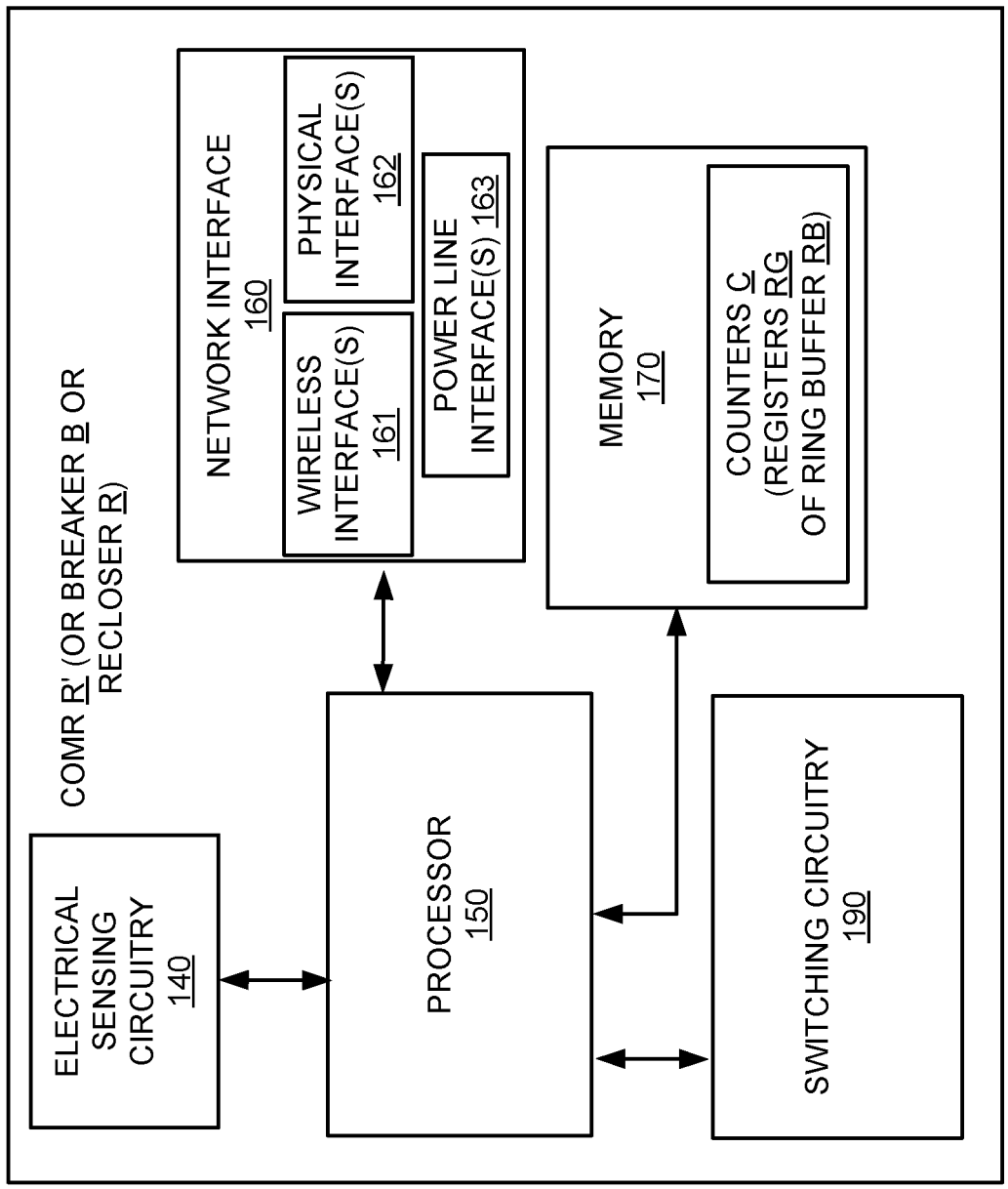
FIG. 1B is a block diagram of the cutout-mounted recloser of FIG. 1A. Moreover, FIG. 1B can serve as a block diagram of the breaker of FIG. 1A or of one of the large reclosers of FIG. 1A.

FIG. 1B is a block diagram of a COMR R' (or breaker B or recloser R) of FIG. 1A. The COMR R' may include electrical sensing circuitry 140, a processor 150, a network interface 160, a memory 170, and switching circuitry 190. The electrical sensing circuitry 140 may include, for example, one or more current sensors and/or one or more voltage sensors that may be configured to measure current, voltage, and/or power quantities. The processor 150 of the COMR R' may be coupled to the network interface 160. The processor 150 may be configured to communicate with a node N (FIG. 1A), the communications network 115 (FIG. 1A), and/or a portable electronic device 102 (FIG. 1A) via the network interface 160.

For example, the network interface 160 may include one or more wireless interfaces 161 and/or one or more physical interfaces 162. The wireless interface(s) 161 may comprise wireless communications circuitry, such as BLUETOOTH® circuitry, cellular communications circuitry that provides a cellular wireless interface (e.g., 4G/5G/LTE, other cellular), and/or Wi-Fi circuitry. The physical interface(s) 162 may comprise wired communications circuitry, such as wired Ethernet, serial, and/or USB circuitry. Moreover, the network interface 160 may include one or more power line interfaces 163, which may comprise PLC circuitry.

The switching circuitry 190 is configured to cut off electric power of a portion of an electrical grid 100 (FIG. 1A). For example, in addition to tripping upon (e.g., shortly after) detection of a fault current, the switching circuitry 190 is configured to lock out in response to a command by the processor 150. In some embodiments, the switching circuitry 190 may be implemented together with the processor 150 and the memory 170 in a programmable feeder protection relay device such as the SEL-751 by Schweitzer Engineering Laboratories, Inc. of Pullman, Washington As an example, the programmable feeder protection relay device may be configured to receive programming instructions from a user in the form of American Standard Code for Information Interchange ("ASCII") characters.

A plurality of counters C may be implemented in the memory 170. For example, the counters C may comprise respective registers RG of a ring buffer RB. Each register RG may operate as a countdown timer that counts down time until the switching circuitry 190 will reset (e.g., reclose without locking out). As another example, the counters C may comprise respective count-up timers. In some embodiments, the memory 170 may comprise two, three, four, five, six, or more of the counters C. Moreover, each counter C (e.g., each register RG) may be configured to count a respective trip of the COMR R'. The counters C can thus collectively indicate a plurality of trips of the COMR R' during a time window.

Figure 1C:
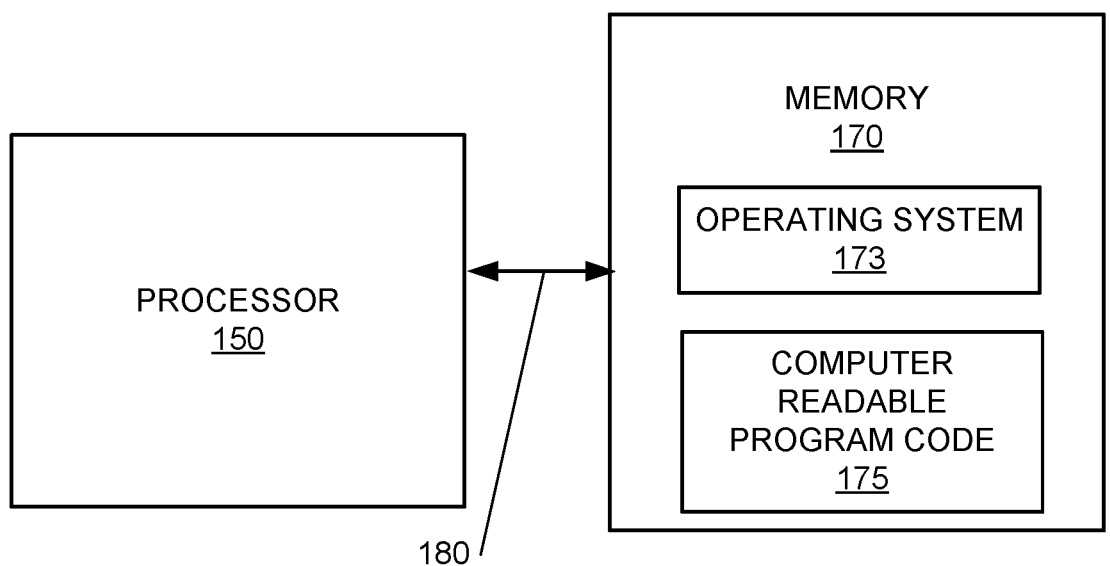
FIG. 1C is a block diagram that illustrates details of the processor and memory of FIG. 1B.

FIG. 1C is a block diagram that illustrates details of an example processor 150 and memory 170 that may be used in accordance with various embodiments. The processor 150 communicates with the memory 170 via an address/data bus 180. The processor 150 may be, for example, a commercially available or custom microprocessor. Moreover, the processor 150 may include multiple processors. The memory 170 may be a non-transitory computer readable storage medium and may be representative of the overall hierarchy of memory devices containing the software and data used to implement various functions of a COMR R' (FIGS. 1A and 1B), a breaker B (FIGS. 1A and 1B), or a recloser R (FIGS. 1A and 1B) as described herein. In some embodiments, a ring buffer RB (FIG. 1B) that counts trips of the COMR R' may be implemented in the memory 170. The memory 170 may include, but is not limited to, the following types of devices: cache, ROM, PROM, EPROM, EEPROM, flash, static RAM ("SRAM"), and dynamic RAM ("DRAM").

As shown in FIG. 1C, the memory 170 may hold various categories of software and data, such as computer readable program code 175 and/or an operating system 173. The operating system 173 controls operations of a COMR R', a breaker B, or a recloser R. In some embodiments, the operating system 173 may manage the resources of the COMR R', the breaker B, or the recloser R and may coordinate execution of various programs by the processor 150. For example, the computer readable program code 175, when executed by a processor 150 of the COMR R', the breaker B, or the recloser R, may cause the processor 150 to perform any of the operations illustrated in the flowcharts of FIGS. 2A-2C.

Figure 2A:
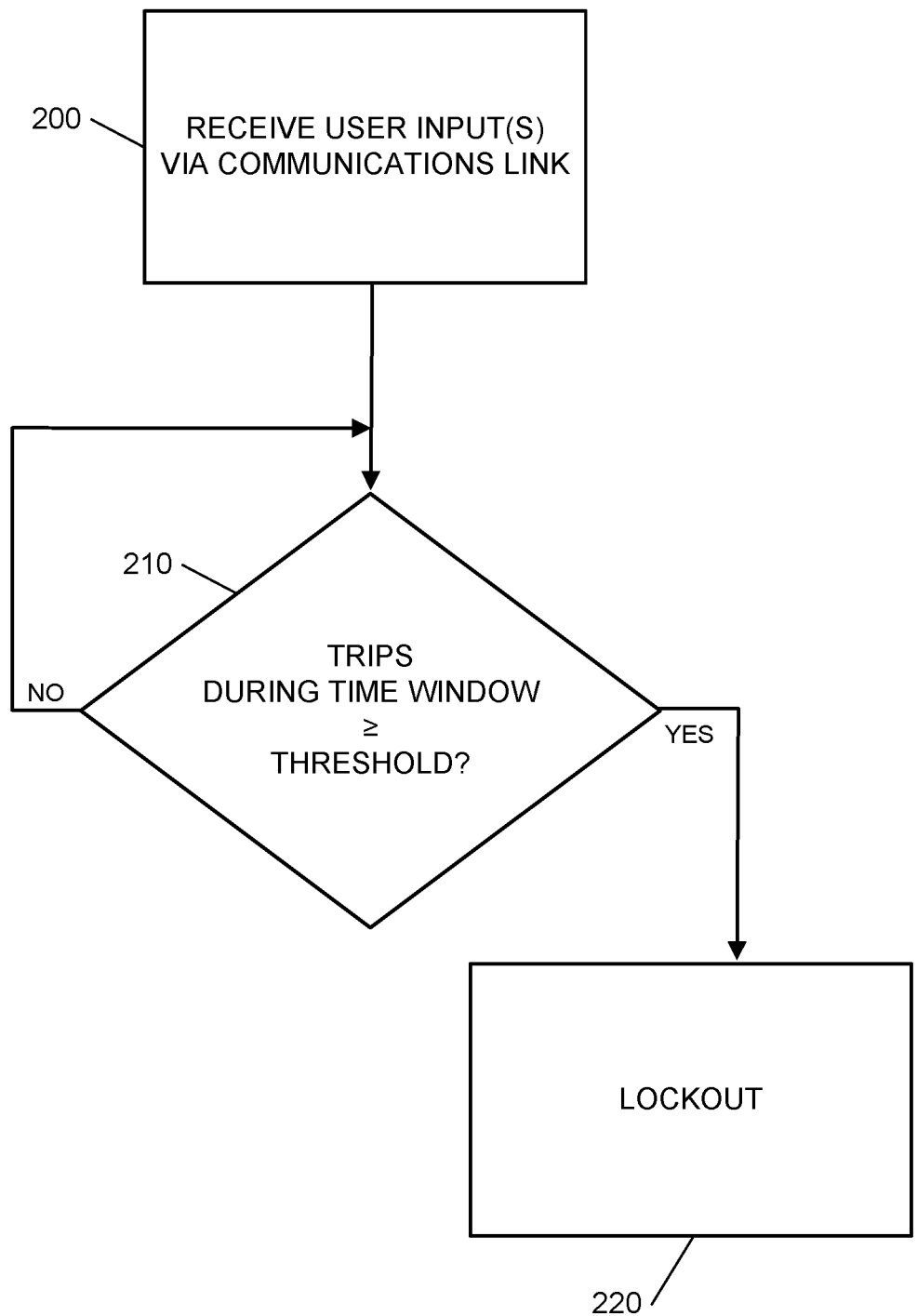
FIGS. 2A-2C are flowcharts of operations of controlling lockout of a switching or isolating component, such as the cutout-mounted recloser of FIG. 1A, of an electrical grid.
Figure 2B:
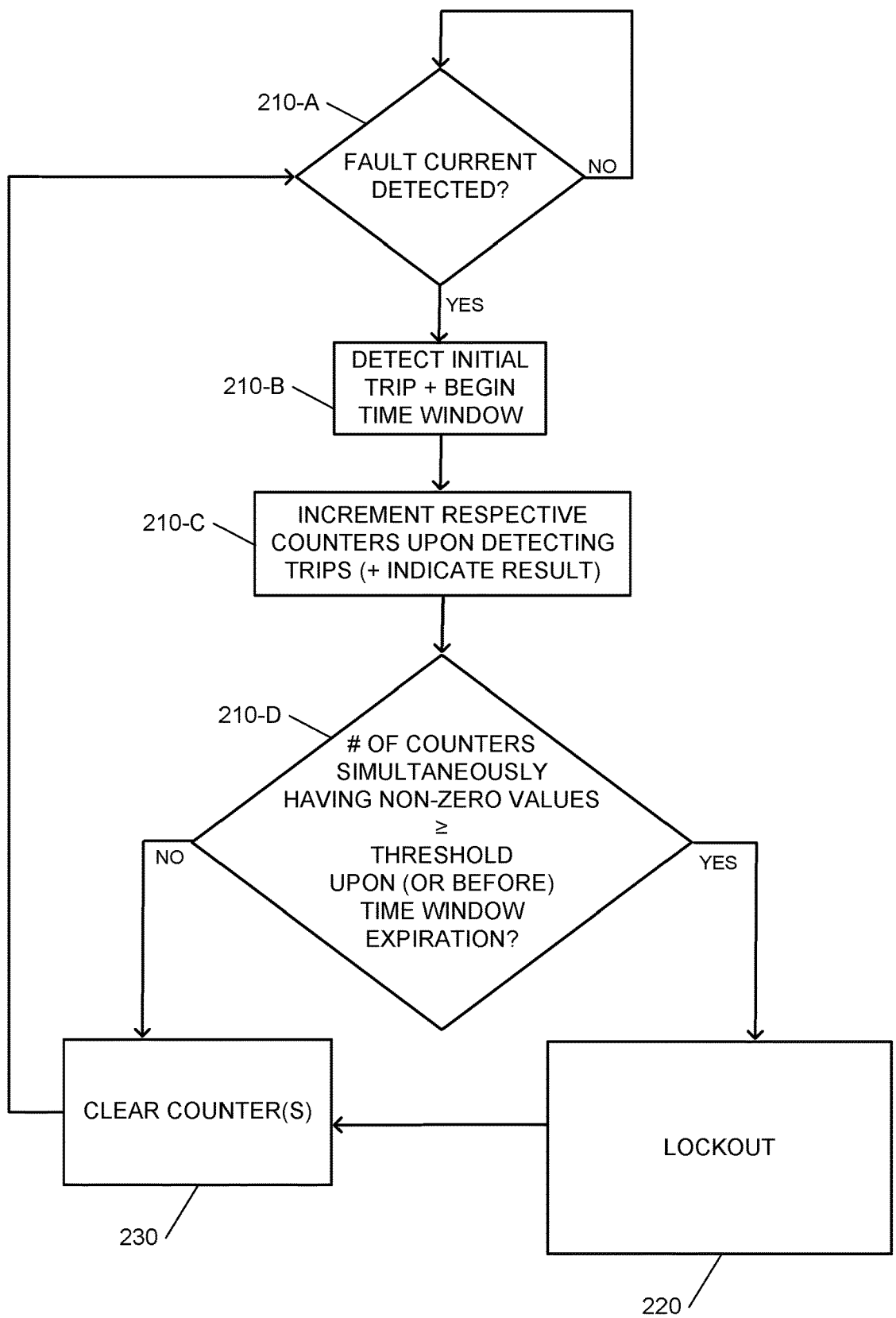
Figure 2C:
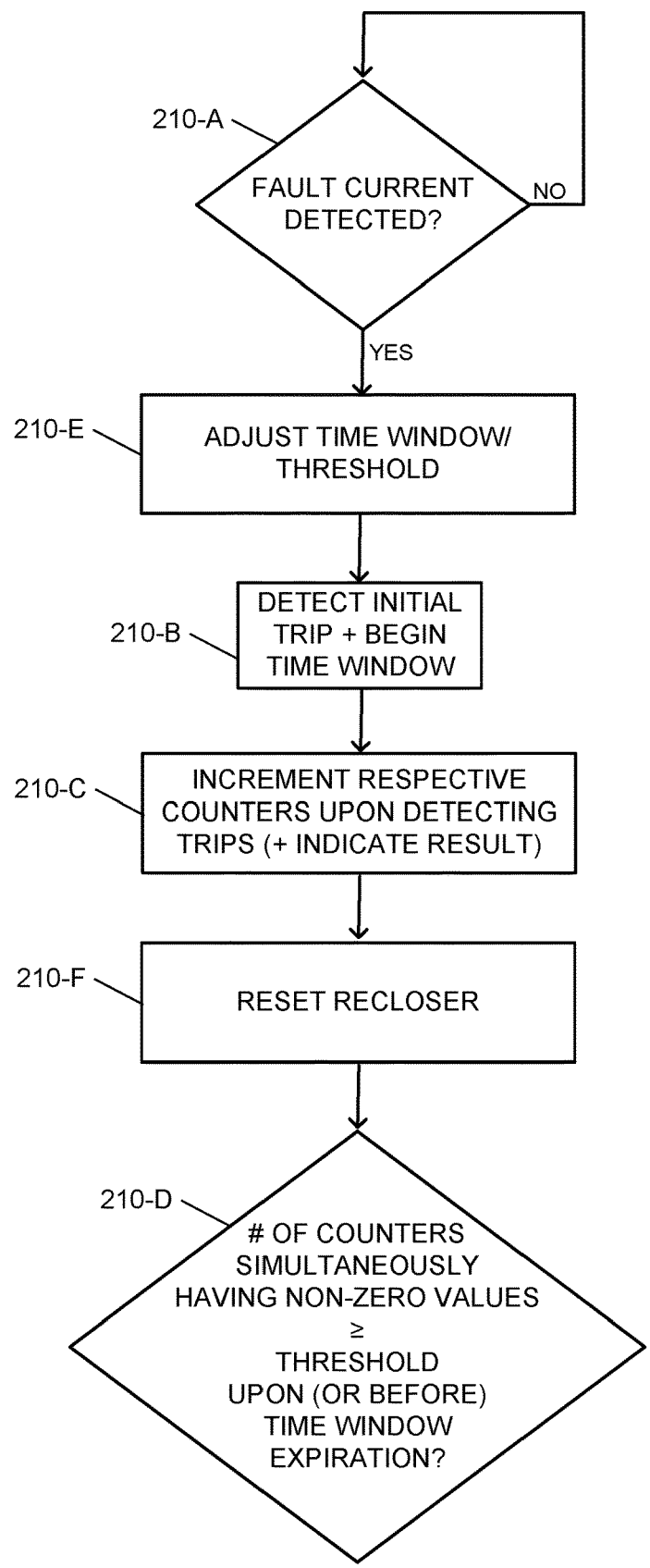

FIGS. 2A-2C are flowcharts of operations of controlling lockout of a switching or isolating component. Referring to FIG. 2A, the operations include receiving (Block 200), such as by a network interface 160 (FIG. 1B) and via a communications network 115 (FIG. 1A) or other communications link, one or more user inputs regarding lockout of a COMR R' (or breaker B or recloser R). For example, a user of a portable electronic device 102 (FIG. 1A) may input (i) a value of a threshold number of trips that the COMR R' must experience over a time window to trigger lockout of the COMR R' and/or (ii) a value of a duration (e.g., in seconds or minutes) of the time window.

Upon detecting a fault current (e.g., current of an arcing fault) at the COMR R' by the electrical sensing circuitry 140 (FIG. 1B) inside the COMR R', a processor 150 (FIG. 1B) inside the COMR R' may then determine (Block 210) whether a number of trips occurring at the COMR R' during a predetermined time window meets or exceeds a predetermined threshold. In some embodiments, the predetermined time window may be longer than sixty seconds and/or the predetermined threshold may be at least two (and no more than twenty) trips. For example, the predetermined time window may be between ninety seconds and twenty minutes and/or the predetermined threshold may be between five and ten trips (or between three and ten trips). As used herein, the term "predetermined" may refer to a user-specified value, such as a value selected by a user of the electronic device 102.

In response to meeting or exceeding the predetermined threshold number of trip occurrences, the processor 150 may command (Block 220) the switching circuitry 190 (FIG. 1B) to drive to lockout. On the other hand, as long as the trip threshold remains unmet (e.g., over a moving time window), the processor 150 may continue monitoring trips of the COMR R' while refraining from locking out the COMR R'.

Moreover, operations of determining (Block 210) whether the number of trips occurring at the COMR R' during the predetermined time window meets or exceeds the predetermined threshold may, in some embodiments, include communicating results of the determination to the electronic device 102 via the network interface 160. For example, the results that are communicated to the electronic device 102 may include information such as (i) the amount of time remaining in the time window and/or (ii) the number of trips that have occurred during the time window. The results may be automatically communicated by the COMR R' or may be responsive to a request that is received from the electronic device 102 via the network interface 160.

Referring to FIG. 2B, detailed operations of determining (Block 210 of FIG. 2A) whether a number of trips occurring at the COMR R' during a predetermined time window meets or exceeds a predetermined threshold are shown. The operations may include (or may be responsive to) detecting (Block 210-A) a fault current at the COMR R'. For example, electrical sensing circuitry 140 (FIG. 1B) of the COMR R' may detect the fault current. For simplicity of illustration, Block 200 of FIG. 2A is omitted from view in FIG. 2B. In some embodiments, however, the COMR R' may detect the fault current after performing the operation of Block 200.

The COMR R' may detect the fault current before an initial trip occurs at the COMR R', as the switching circuitry 190 (FIG. 1B), such as a relay, may not trip until the fault current reaches a duration and/or magnitude that is significantly greater than that which is initially detectable by the COMR R'. In response to detecting (Block 210-B) that the fault current causes an initial trip operation in the COMR R', the COMR R' may begin the predetermined time window. For example, responsive to the processor 150 (FIG. 1B) detecting (e.g., based on current detected by the electrical sensing circuitry 140) the initial trip operation within a predetermined amount of time (e.g., within fifteen seconds or thirty seconds) after detecting the fault current, a first counter C (FIG. 1B) may be loaded/incremented, thereby starting the predetermined time window. As an example, a value (e.g., ninety) representing a total number of seconds of the predetermined time window may be loaded onto the counter C. As another example, a value of one, which represents the occurrence of one trip, may be loaded onto the counter C. On the other hand, if no trip operation follows the fault current, then the counter C will maintain a value of zero and the COMR R' will refrain from starting the predetermined time window. The counter C will also maintain a value of zero after the predetermined time window expires.

The predetermined time window may, in some embodiments, be a single time window that begins responsive to detecting the initial trip and counts global time for all of the counters C. In other embodiments, each counter C may be loaded with a respective predetermined time window.

In some embodiments, the processor 150 may start a timer that increments or decrements time (e.g., seconds or portions thereof) until the predetermined time window expires. As an example, the processor 150 may start a timer by loading a value onto an initial/first counter C in response to the initial trip at the COMR R'. Moreover, the processor 150 may increment (Block 210-C) a plurality of counters C (e.g., a plurality of subsequent counters C following the initial/first counter C) in response to detecting a plurality of trips, respectively, occurring at the COMR R'. For example, the processor 150 may load the counters C with (e.g., increment the counters C to) a predetermined value, such as 90 or 1. In embodiments in which the counters C only count time (e.g., ninety seconds), the counters C begin decrementing the predetermined value once it is loaded. Moreover, ones of the counters C that are loaded/incremented after loading/incrementing the initial/first counter C may, in some embodiments, each be loaded/incremented during the predetermined time period that is triggered by the initial trip at (e.g., the initial time period that is decremented at) the initial/first counter C.

In some embodiments, each counter C may store exactly one of only two values, such as either a 0 or a 1. As an example, after incrementing a first counter C (e.g., from a value of 0 to a value of 1) in response to detecting a first trip occurring at the COMR R', the processor 150 may increment a second counter C (e.g., from a value of 0 to a value of 1) in response to detecting a second trip occurring at the COMR R'. The processor 150 may likewise increment third, fourth, fifth, sixth, or more counters C in response to detecting third, fourth, fifth, sixth, or more trips, respectively, occurring at the COMR R'. Accordingly, by contrast with a conventional technique of using a single state machine (e.g., a single counter) to count trips, the COMR R' may use at least two (or at least three, at least four, etc.) counters C. Moreover, the counters C may, in some embodiments, be implemented in the memory 170 (FIG. 1B). For example, the counters C may comprise respective registers RG (FIG. 1B) of a ring buffer RB (FIG. 1B) that is implemented in the memory 170.

The processor 150 can determine (Block 210-D) whether the number of (i.e., how many) counters C simultaneously holding respective non-zero values (e.g., is or values representing remaining time) meets or exceeds a predetermined threshold upon (or before) expiration of the time window. If so, then the processor 150 can provide a command to the switching circuitry 190 (FIG. 1B) to drive (Block 220) the COMR R' to lockout. On the other hand, if the number is smaller than the threshold when the time window expires, then the processor 150 can clear (Block 230) the counters C, such as by resetting to zero the value of each counter C holding a non-zero value. Moreover, the processor 150 can clear the counters C after (e.g., in response to) driving the COMR R' to lockout. Accordingly, the COMR R' may, in some embodiments, refrain from clearing any non-zero value held by a respective counter C until either (a) the time window expires or (b) the COMR R' drives to lockout.

In some embodiments, the non-zero values comprise respective non-zero values of time remaining on the counters C as they count down. For example, if a trip is detected at time 0 and a first counter C is loaded with 90 seconds (as the time window length), then at time=15 seconds that counter C may hold 75 (seconds), which is a non-zero value.

For simplicity of illustration, Blocks 210-C and 210-D are shown in succession in FIG. 2B. In some embodiments, however, operations of Blocks 210-C and 210-D may occur concurrently. For example, the processor 150 may repeatedly determine (e.g., in response to each incrementation of a respective counter C), during the time window, whether the number of counters C having non-zero values meets or exceeds the threshold. The processor 150 thus does not have to wait until expiration of the time window to drive the COMR R' to lockout, if the number of counters C having non-zero values meets or exceeds the threshold before the time window expires.

Referring to operations of Blocks 210-B through 210-D, the counter C that is loaded responsive to the initial trip may, in some embodiments, hold a non-zero value simultaneously with subsequently-loaded counters C (i.e., after the subsequent counters C are loaded with non-zero values). Moreover, the processor 150 may begin comparing the total number of counters C having a non-zero value with the threshold upon detecting the initial trip. Accordingly, though Blocks 210-B through 210-D are shown successively in FIG. 2B, operations of two or more of Blocks 210-B through 210-D may occur concurrently.

In some embodiments, the term "predetermined time period," as used herein, may refer to the initial/global time period that begins decrementing at an initial (i.e., first) counter C in response to the initial trip. Additionally or alternatively, the term "predetermined time period" may refer to a time period that begins decrementing at a subsequent (e.g., second) counter C in response to a subsequent (e.g., second) trip. The term "predetermined time period" is thus not limited to the initial/global time period that begins decrementing in response to the initial trip.

Moreover, incrementing (Block 210-C) the counters C may, in some embodiments, include providing an indication of (i) the remaining time in the time window and/or (ii) a total number of the trips/increments that have occurred during the time window. The indication may be provided (e.g., transmitted) to the portable electronic device 102 (FIG. 1A) via the network interface 160 (FIG. 1B) and/or may be displayed via a graphical user interface ("GUI") that is on or adjacent the COMR R' (or another switching or isolating component at which a fault current is detected). In other embodiments, the counters C may be incremented (Block 210-C) without providing an indication of the incrementation result via the network interface 160 and/or via a local GUI.

Referring to FIG. 2C, additional detailed operations of determining (Block 210 of FIG. 2A) whether a number of trips occurring at the COMR R' during a predetermined time window meets or exceeds a predetermined threshold are shown. The time window may be referred to herein as a "global" time window, as it may encompass/include a plurality of trips and a plurality of incrementations of respective counters C (FIG. 1B). As shown in FIG. 2C, the COMR R' may, in some embodiments, adjust (Block 210-E) (i) a value (and thus a length) of the time window and/or (ii) a value of the threshold number of trips. For example, the processor 150 (FIG. 1B) may make the adjustment(s) in real time responsive to (a) determining that the detected fault current is above (or below) a threshold fault current value and/or (b) detecting damage to a cable/overhead conductor. User input(s), by contrast, may be received (Block 200 of FIG. 2A) via the network interface 160 (FIG. 1B) before detecting (Block 210-A) the fault current.

FIG. 2C also shows that the COMR R' may be reset (Block 210-F) in some embodiments. As an example, the processor 150 may reset (e.g., reclose without locking out) the switching circuitry 190 (FIG. 1B) upon completion of a predetermined time period after detecting a trip thereof. The predetermined time period may be shorter than the global/moving time window for which the number of counters C having non-zero values is compared with the threshold number of trips. In some embodiments, the predetermined time period may thus expire before the longer, global/moving time window expires. Accordingly, the COMR R' may continue determining (Block 210-D) whether the number of trips meets or exceeds the threshold, after resetting the COMR R' and until driving the COMR R' to lockout or expiration of the global/moving time window.

For simplicity of illustration, Blocks 210-E and 210-F are both shown in FIG. 2C. In some embodiments, however, operation(s) of one of the Blocks 210-E and 210-F may be omitted without omitting operation(s) of the other one of the Blocks 210-E and 210-F. As an example, the COMR R' may be reset (Block 210-F) one or more times and neither the global/moving time window nor the threshold number of trips may be adjusted (Block 210-E). Moreover, though Blocks 210-D and 210-F are shown in succession in FIG. 2C, operations of Blocks 210-D and 210-F may occur concurrently. Resetting (Block 210-F) the COMR R', such as by resetting a relay of the switching circuitry 190, may thus occur during the global/moving time window.

For further simplicity of illustration, Blocks 200, 220, and 230 (FIGS. 2A and 2B) are omitted from view in FIG. 2C. It will be understood, however, that the COMR R' may receive (Block 200) user input(s) before detecting (Block 210-A) the fault current, and may be driven to lockout (Block 220) and/or may have a value of one or more of its counters C cleared (Block 230) after determining (Block 210-D) whether the number of trips meets or exceeds the threshold.

Methods of controlling lockout of a switching or isolating component, such as a COMR R' (FIG. 1A), of an electrical grid 100 (FIG. 1A) according to embodiments of the present invention may provide a number of advantages. These advantages include limiting fault energy, and thereby inhibiting/preventing overhead conductors from falling to the ground due to loss of structural strength. Though conventional approaches accepted the failure of some conductors, the present invention reduces failure of conductors (e.g., wires attached to the COMR R'), and thereby reduces the risk of fire or other hazards due to faulted conductors. For example, some embodiments of the present invention are more sensitive to ongoing low fault current (and thus more likely to drive to lockout) than conventional approaches because these embodiments continue to count trips during a predetermined global/moving time window (e.g., one minute), even if the switching or isolating component resets after (e.g., fifteen seconds after) a trip. This higher degree of sensitivity may be accomplished by using a plurality of counters C (FIG. 1B) that count respective trips of the switching circuitry 190 (FIG. 1B) and do not clear until either lockout or expiration of the global/moving time window. By contrast, conventional approaches may use a single counter that clears after each recloser/relay reset, and thus may be less likely to drive to lockout, especially in the context of an arcing fault that results in a current spike followed by ongoing low current.

Though various examples are discussed herein with respect to a COMR R', any of the operations illustrated in the flowcharts of FIGS. 2A-2C may, in some embodiments, be implemented by a breaker B (FIG. 1A), a recloser R (FIG. 1A), or another switching or isolating component of the grid 100. As an example, any of the operations illustrated in the flowcharts of FIGS. 2A-2C may be implemented by a programmable feeder protection relay device.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the present invention are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments of the present invention should not be construed as limited to the particular shapes illustrated herein but may include deviations in shapes that result, for example, from manufacturing.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present invention.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. A method of controlling lockout of a recloser of an electrical grid, the method comprising:
   detecting, by the recloser, a fault current at the recloser;
   responsive to detecting the fault current, tripping a switching or isolating component of the recloser;
   responsive to tripping the switching or isolating component, recording a time of occurrence of the tripping;
   responsive to recording the time of occurrence of the tripping, determining whether a count of trippings of the switching or isolating component at or prior to the time of occurrence within a predetermined time period meets or exceeds a predetermined threshold of trippings; and
   responsive to the count of the trippings of the switching or isolating component at or prior to the time of occurrence within the predetermined time period meeting or exceeding the predetermined threshold of trippings, driving the recloser to lockout.

2. The method of claim 1, further comprising resetting the recloser after detecting the fault current and before expiration of the predetermined time window.

3. The method of claim 2, wherein the recloser continues determining whether the number of trips meets or exceeds the predetermined threshold, after resetting the recloser and until driving the recloser to lockout or expiration of the predetermined time window.

4. The method of claim 1, wherein determining whether the number of trips meets or exceeds the predetermined threshold comprises:
   determining a number of a plurality of registers of a ring buffer that simultaneously have respective non-zero values.

5. The method of claim 4, further comprising refraining from clearing the respective non-zero value of any of the registers until driving the recloser to lockout or expiration of the predetermined time window.

6. The method of claim 4, wherein the predetermined number of registers comprises at least 2 registers and no more than 20 registers.

7. The method of claim 1, wherein determining whether the number of trips meets or exceeds the predetermined threshold comprises:
   determining a number of a plurality of counters that simultaneously have respective non-zero values.

8. The method of claim 7, further comprising refraining from clearing the respective non-zero value of any of the counters until driving the recloser to lockout or expiration of the predetermined time window.

9. The method of claim 7, wherein the counters comprise respective registers of a ring buffer.

10. The method of claim 1, wherein the predetermined time window is at least 90 seconds.

11. The method of claim 1, wherein the predetermined threshold is at least 5 trips.

12. The method of claim 1,
   wherein the recloser comprises a cutout-mounted recloser comprising electrical sensing circuitry, a processor, a network interface, and switching circuitry,
   wherein detecting the fault current is performed by the electrical sensing circuitry, wherein determining whether the number of trips meets or exceeds the predetermined threshold is performed by the processor, and
   wherein driving the recloser to lockout comprises providing a command from the processor to the switching circuitry.

13. The method of claim 12, further comprising receiving, by the network interface, a user input comprising a value of the predetermined time window, before detecting the fault current.

14. The method of claim 12, further comprising receiving, by the network interface, a user input comprising a value of the predetermined threshold, before detecting the fault current.

15. A method of controlling lockout of a switching or isolating component of an electrical grid, the method comprising:
   responsive to a plurality of trips occurring at the switching or isolating component, loading, by the switching or isolating component, a plurality of counters, respectively, and determining whether a number of the trips meets or exceeds a predetermined threshold comprising determining how many of the counters simultaneously have respective non-zero values;
   responsive to meeting or exceeding the predetermined threshold, driving the switching or isolating component to lockout; and
   refraining from clearing the respective non-zero values of the counters until driving the switching or isolating component to lockout or expiration of a predetermined time window.

16. The method of claim 15, wherein the switching or isolating component comprises a recloser.

17. The method of claim 15, further comprising detecting, by the switching or isolating component, a fault current at the switching or isolating component, wherein the predetermined time window begins in response to detecting an initial one of the trips after detecting the fault current.

18. A recloser comprising:
   electrical sensing circuitry that is configured to detect a fault current in a conductor;
   a processor that is configured to determine whether a number of trips occurring at the recloser during a predetermined time window meets or exceeds a predetermined threshold, wherein the predetermined time window is measured backward in time from a time of occurrence of a first recent-most trip at the recloser; and
   switching circuitry that is configured to drive the recloser to lockout in response to a command from the processor, in response to the processor determining that the number of trips during the predetermined time window meets or exceeds the predetermined threshold.

19. The recloser of claim 18, wherein determining whether the number of trips meets or exceeds the predetermined threshold comprises:
   determining a number of a plurality of counters that simultaneously have respective non-zero values.

* * * * *